US009172057B2

(12) United States Patent
Baisl et al.

(10) Patent No.: US 9,172,057 B2
(45) Date of Patent: Oct. 27, 2015

(54) ENCAPSULATION STRUCTURE FOR AN OPTO-ELECTRONIC COMPONENT

(75) Inventors: Richard Baisl, Regensburg (DE); Dirk Becker, Langquaid (DE); Thomas Dobbertin, Regensburg (DE); Doreen Heppner, Koefering (DE); Benjamin Krummacher, Regensburg (DE); Erwin Lang, Regensburg (DE); Tilman Schlenker, Nittendorf (DE); Christian Schmid, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/129,997

(22) PCT Filed: Jun. 20, 2012

(86) PCT No.: PCT/EP2012/061892
§ 371 (c)(1),
(2), (4) Date: Apr. 8, 2014

(87) PCT Pub. No.: WO2013/000797
PCT Pub. Date: Jan. 3, 2013

(65) Prior Publication Data
US 2014/0252406 A1    Sep. 11, 2014

(30) Foreign Application Priority Data

Jun. 30, 2011    (DE) .................. 10 2011 078 404
Jul. 14, 2011    (DE) .................. 10 2011 079 160

(51) Int. Cl.
H01L 51/52    (2006.01)
H01L 51/44    (2006.01)

(52) U.S. Cl.
CPC .......... *H01L 51/5253* (2013.01); *H01L 51/448* (2013.01); *H01L 51/5237* (2013.01)

(58) Field of Classification Search
CPC .............. H01L 51/448; H01L 51/5237; H01L 51/5253
See application file for complete search history.

(56) References Cited

U.S. PATENT DOCUMENTS 5,406,164 A *  4/1995  Okawa et al. ................. 310/366
6,592,969 B1   7/2003  Burroughes et al.
(Continued)

FOREIGN PATENT DOCUMENTS

CN    1973579 A    5/2007
CN    101176214 A   5/2008
(Continued)

OTHER PUBLICATIONS

Office Action issued in the parallel Korean patent application No. 10-2014-7002607 on Nov. 12, 2014 with English translation.
(Continued)

*Primary Examiner* — Ida M Soward

(57) ABSTRACT

An encapsulation structure for an optoelectronic component, may include: a thin-film encapsulation for protecting the optoelectronic component against chemical impurities; an adhesive layer formed on the thin-film encapsulation; and a cover layer formed on the adhesive layer and serving for protecting the thin-film encapsulation and/or the optoelectronic component against mechanical damage, wherein the adhesive layer is formed such that particle impurities situated at the surface of the thin-film encapsulation are at least partly enclosed by the adhesive layer.

13 Claims, 6 Drawing Sheets

(56) References Cited

U.S. PATENT DOCUMENTS

| | | | |
|---|---|---|---|
| 6,706,961 B2 * | 3/2004 | Shimizu et al. | 136/256 |
| 7,187,119 B2 * | 3/2007 | Weaver | 313/504 |
| 7,619,359 B2 | 11/2009 | Kim | |
| 7,868,778 B2 * | 1/2011 | Kenwright | 340/686.6 |
| 8,072,138 B2 | 12/2011 | Masuda et al. | |
| 8,093,610 B2 * | 1/2012 | Wilm et al. | 257/98 |
| 8,125,145 B2 | 2/2012 | Fiebranz | |
| 8,222,811 B2 | 7/2012 | Vaufrey et al. | |
| 8,328,375 B2 * | 12/2012 | Diekmann et al. | 362/84 |
| 8,334,086 B2 | 12/2012 | Sawano | |
| 8,466,476 B2 * | 6/2013 | Ma et al. | 257/88 |
| 8,629,603 B2 | 1/2014 | Baisl | |
| 8,658,442 B2 * | 2/2014 | Schmid et al. | 438/26 |
| 8,742,430 B2 | 6/2014 | Shimizu et al. | |
| 8,915,121 B2 * | 12/2014 | Kumar et al. | 73/31.03 |
| 2003/0207488 A1 * | 11/2003 | Carcia et al. | 438/82 |
| 2005/0023974 A1 * | 2/2005 | Chwang et al. | 313/512 |
| 2005/0269952 A1 | 12/2005 | Kim | |
| 2007/0182307 A1 * | 8/2007 | Taguchi et al. | 313/484 |
| 2008/0050585 A1 | 2/2008 | Masuda et al. | |
| 2008/0163926 A1 * | 7/2008 | Huang et al. | 136/261 |
| 2008/0169758 A1 | 7/2008 | Cok | |
| 2008/0197764 A1 | 8/2008 | Bechtel et al. | |
| 2009/0091258 A1 * | 4/2009 | Heuser et al. | 313/512 |
| 2009/0195152 A1 | 8/2009 | Sawano | |
| 2010/0019664 A1 | 1/2010 | Mishima | |
| 2010/0059778 A1 | 3/2010 | Shimizu et al. | |
| 2011/0100458 A1 * | 5/2011 | Kang et al. | 136/259 |
| 2011/0132449 A1 * | 6/2011 | Ramadas et al. | 136/256 |
| 2011/0272682 A1 * | 11/2011 | Blizzard et al. | 257/40 |
| 2011/0300770 A1 * | 12/2011 | Fukuda et al. | 445/58 |
| 2012/0193816 A1 * | 8/2012 | Schmid et al. | 257/787 |
| 2012/0211078 A1 * | 8/2012 | Kato et al. | 136/257 |
| 2014/0179040 A1 * | 6/2014 | Ramadas et al. | 438/27 |

FOREIGN PATENT DOCUMENTS

| | | |
|---|---|---|
| CN | 101632010 A | 1/2010 |
| DE | 102006060781 A1 | 4/2008 |
| DE | 102007038324 A1 | 2/2009 |
| DE | 102006000993 B4 | 12/2010 |
| DE | 102009054742 A1 | 6/2011 |
| JP | 2005-347274 A | 12/2005 |
| JP | 2008-10211 A | 1/2008 |
| JP | 2009110930 A | 5/2009 |
| JP | 2009-187804 A | 8/2009 |
| JP | 2010-27429 A | 2/2010 |
| JP | 2010-33734 A | 2/2010 |
| JP | 2010-67464 A | 3/2010 |
| KR | 20070030194 A | 3/2007 |
| KR | 1020080010458 A | 1/2008 |
| KR | 1020110045820 A | 5/2011 |
| WO | 2005122644 A1 | 12/2005 |
| WO | 2006120610 A1 | 11/2006 |
| WO | 2008082362 A1 | 7/2008 |
| WO | 2010004124 A1 | 1/2010 |

OTHER PUBLICATIONS

International Search Report issued for PCT/EP2012/061892 mailed Oct. 15, 2012.

Office Action in the corresponding Japanese application No. 2014-517602 dispatched on Jan. 5, 2015, 2 pages of Office Action and 3 pages of English translation.

Korean Office Action based on application No. 10-2014-7002607 (6 pages of English translation) dated Nov. 12, 2014.

Chinese Office Action based on Application No. 201280032683.8 (10 Pages and 9 Pages of English translation) dated Jun. 19, 2015 (Reference Purpose Only).

* cited by examiner

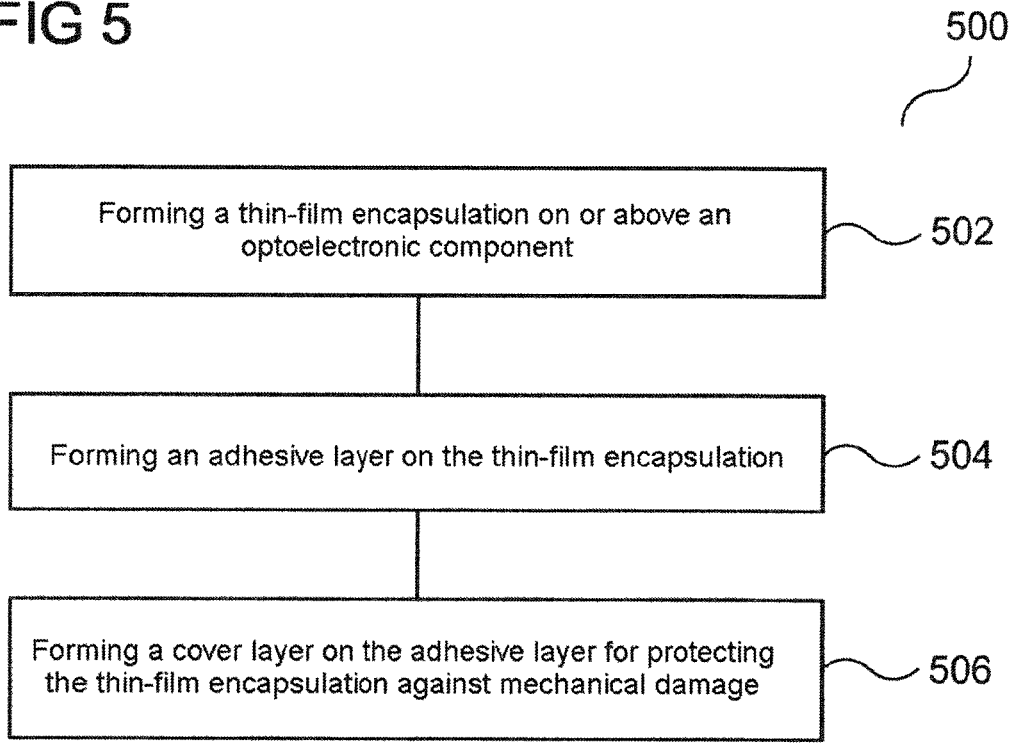
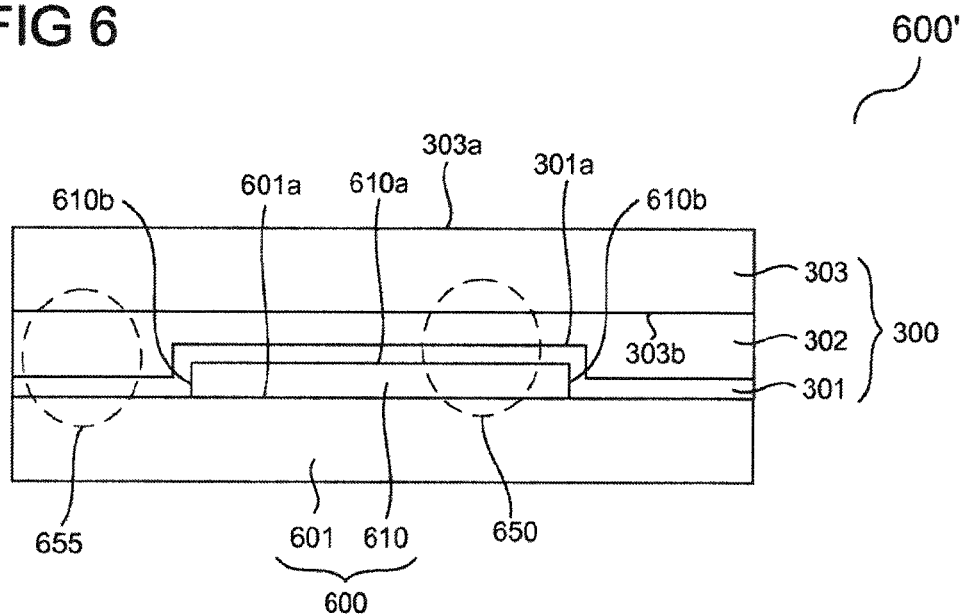

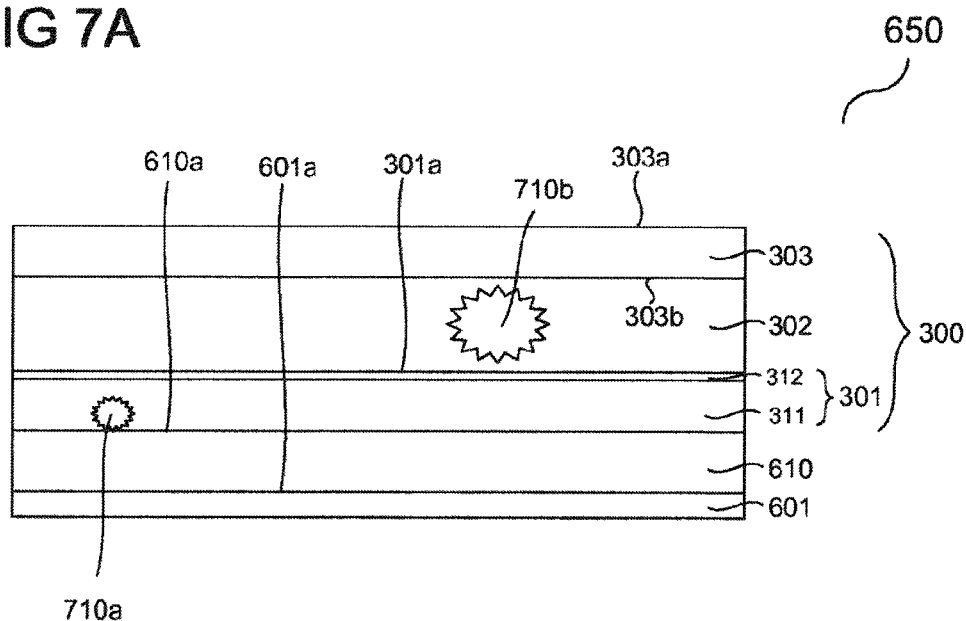
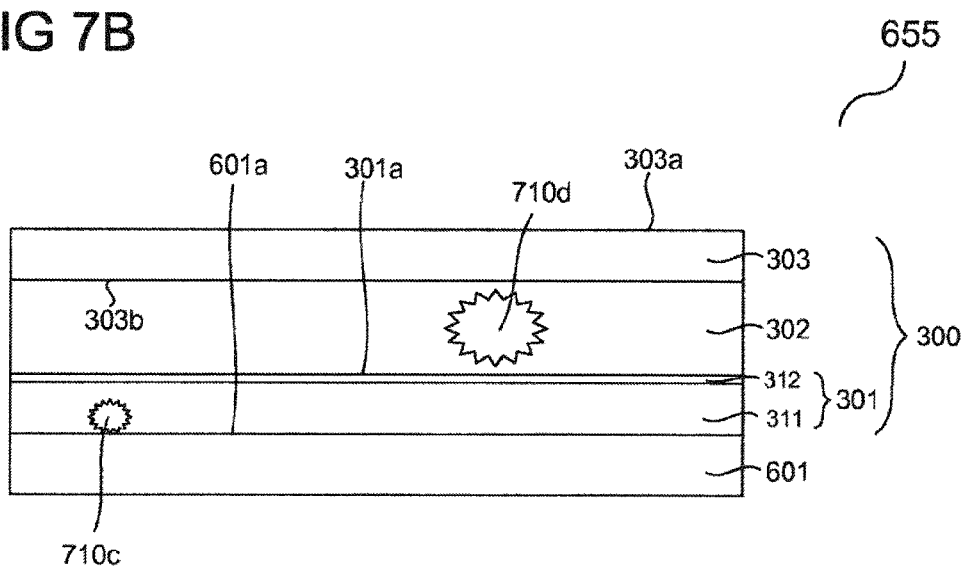

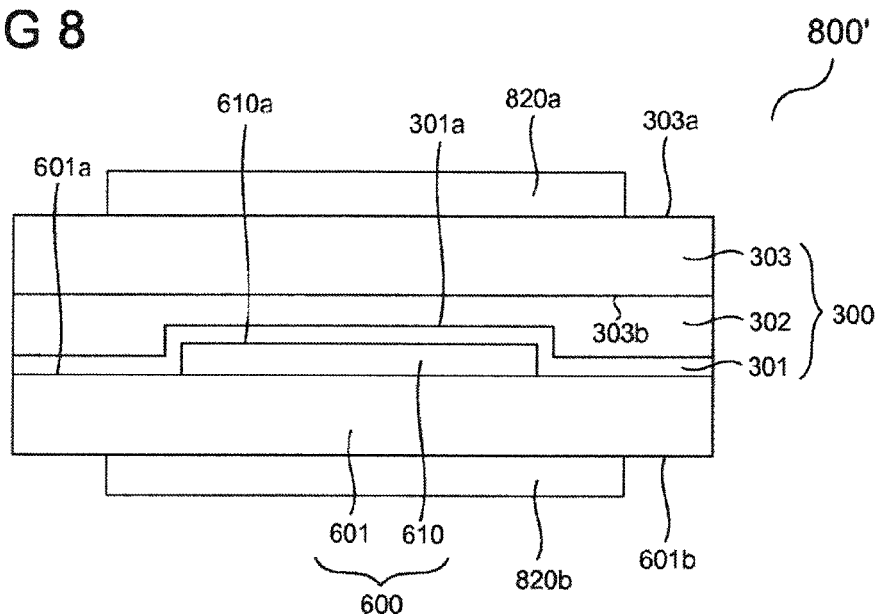
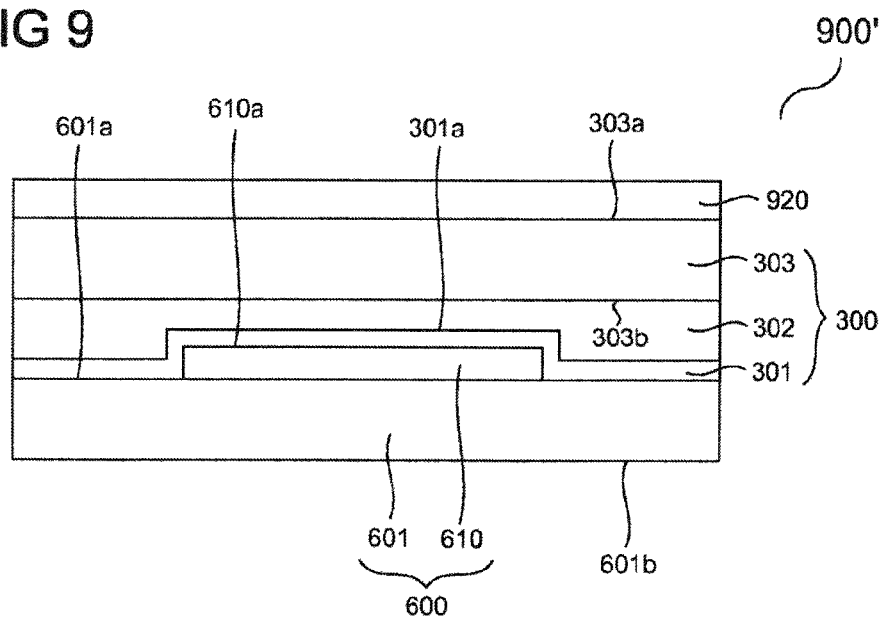

ENCAPSULATION STRUCTURE FOR AN
OPTO-ELECTRONIC COMPONENT

RELATED APPLICATIONS

This application is a national stage entry according to U.S.C. §371 of PCT application No.: PCT/EP2012/061892 filed on Jun. 20, 2012, which claims priorities from German application No.: 10 2011 078 404.7 filed on Jun. 30, 2011 and German application No.: 10 2011 079 160.4 filed on Jul. 14, 2011, is incorporated herein by reference in its entirety.

TECHNICAL FIELD

Various embodiments relate to an encapsulation structure for an optoelectronic component and to a method for encapsulating an optoelectronic component.

BACKGROUND

In the manufacture of optoelectronic components or devices, in particular organic optoelectronic devices such as, for example, organic light emitting diodes (OLEDs), OLED displays or organic solar cells or photovoltaic cells (organic photovoltaic (OPV) cells), it is desirable firstly to hermetically seal the devices against air (in particular against moisture (water) and oxygen contained in the air), and secondly to protect them against mechanical damage (e.g. scratches), in order to avoid failure of the device.

The sealing of the device or the protection of the device against mechanical damage can be achieved by means of an encapsulation of the device.

For the encapsulation and mechanical packaging of organic optoelectronic components (e.g. OLEDs) on glass substrates, the encapsulation by means of glass cavities is known. In this technique, a glass cover is adhesively bonded onto the component (device) using a specific adhesive. This technique can largely prevent the ingress of harmful influences. However, in the region of the adhesive bond, water and oxygen can still diffuse into the component. As a countermeasure in this respect, water- and oxygen-binding materials (so-called getters) can be introduced (e.g. adhesively bonded) into the cavity. By way of example, non-transparent getters composed of zeolite can be adhesively bonded into the cavity. The getters can absorb the water and oxygen before the organic materials are damaged. The glass cover can simultaneously afford sufficient mechanical protection.

FIG. 1 shows an arrangement 100' including an organic light emitting diode (OLED) 100 and conventional encapsulation by means of a glass cavity in accordance with one example.

The OLED 100 includes a substrate glass 101. A functional layer stack (OLED stack) 102 is arranged on the substrate glass 101. The functional layer stack 102 may include one or a plurality of organic functional layers (i.e. layers that serve for generating light). Furthermore, electrodes can be provided for making electrical contact with the organic functional layers. An encapsulation glass 103 (also designated as cover glass or cap glass) is adhesively bonded onto the substrate 101 and encloses the functional layer stack 102 in such a way that a cavity (a hollow space) 104 is formed. A getter 105 is introduced into the cavity 104 (by adhesive bonding onto the inner side of the encapsulation glass 103 above the functional layer stack 102), which getter is intended to absorb water and/or oxygen penetrating through the adhesive bond between substrate 101 and encapsulation glass 103 and in this way is intended to prevent the water and/or oxygen from damaging the layer(s) of the functional layer stack 102. The OLED 100 is embodied as a bottom emitter, i.e. the light emission takes place through the transparent substrate glass 101. The getter 105 may consist of a non-transparent material (e.g. zeolite).

FIG. 2 shows an arrangement 200' including an organic light emitting diode (OLED) 100 with conventional encapsulation by means of a glass cavity in accordance with another example.

The arrangement 200' differs from the arrangement 100' shown in FIG. 1 in that, instead of one individual large getter 105 (as in FIG. 1), two smaller getters 205 are introduced into the cavity 104. The two getters 205 are adhesively bonded on the inner side of the encapsulation glass 103 in edge regions of the encapsulation glass 103. The OLED 100 can be embodied as a transparent OLED (light emission both downward through the substrate glass 101 and upward through the encapsulation glass 103), or as a top emitter (light emission only upward through the encapsulation glass 103). As an alternative to the arrangement shown in FIG. 2 including two getters 205 arranged in edge regions, one or a plurality of perforated getters can also be introduced or provided in the cavity 104.

The method of cavity encapsulation is very cost-intensive overall. Moreover, the use of (rigid) glass covers or glass cavities is not suitable for the manufacture of flexible (i.e. pliable) components (e.g. flexible OLEDs).

SUMMARY

In accordance with various embodiments of the disclosure, provision is made for sealing optoelectronic components, for example organic optoelectronic components such as e.g. OLEDs, by applying one or a plurality of thin films (thin layers or thin-film layers) against water and oxygen (so-called thin-film encapsulation). Such a thin-film encapsulation can be mechanically sensitive and should (just like the component itself) be protected against contact or scratching. In accordance with various embodiments, this is achieved by means of applying a cover layer as mechanical protective layer, wherein an adhesive layer (e.g. lamination adhesive layer) for adhesion promotion is provided between the thin-film encapsulation and the cover layer. In accordance with various embodiments, applying the cover layer can be realized, for example, by areal lamination of a flat cover glass. Mechanical protection of the component and of the thin-film encapsulation can be achieved by the glass. By means of an encapsulation structure which is formed in this way and which includes—as described above—a thin-film encapsulation, an adhesive layer and a cover layer, a simple, reliable and cost-effective encapsulation of optoelectronic components (e.g. organic optoelectronic component such as e.g. OLEDs) is possible. In addition, the encapsulation structure proposed can reduce or completely prevent the occurrence of defects attributable to possible particles at or on the thin-film encapsulation or on or in the adhesive layer (e.g. lamination adhesive layer), as will be described further below.

The encapsulation by means of thin layers or by means of thin-film methods is also suitable for flexible components (e.g. flexible OLEDs) on foil substrates (e.g. steel foil or polymer foil substrates). For protection against contact and damage, here for example foils can be laminated onto the substrate foil or the substrate foil can be laminated between two packaging foils.

In various embodiments, provision is made of a particle-tolerant encapsulation and protective coating for optoelectronic components, for example organic optoelectronic components such as e.g. OLEDs.

In various embodiments, provision is made of an encapsulation structure for optoelectronic components, for example organic optoelectronic components such as e.g. OLEDs, in which damage to the optoelectronic component or optoelectronic components as a result of particle impurities is completely or partly avoided.

In various embodiments, provision is made of a particle-tolerant method for applying protective films on an optoelectronic component, for example an organic optoelectronic component such as e.g. an OLED.

In various embodiments, an encapsulation structure for an optoelectronic component includes: a thin-film encapsulation for protecting the optoelectronic component against chemical impurities, an adhesive layer formed on the thin-film encapsulation and a cover layer formed on the adhesive layer and serving for protecting the thin-film encapsulation and/or the optoelectronic component against mechanical damage.

In various embodiments, a method for encapsulating an optoelectronic component includes: forming a thin-film encapsulation on or above an optoelectronic component for protecting the optoelectronic component against chemical impurities; forming an adhesive layer on the thin-film encapsulation; forming a cover layer on the adhesive layer for protecting the thin-film encapsulation and/or the optoelectronic component against mechanical damage.

In various embodiments, an encapsulation arrangement includes an optoelectronic component and an encapsulation structure. The optoelectronic component has at least one functional layer. The encapsulation structure is formed on or above the at least one functional layer. The encapsulation structure can be formed in accordance with one or more of the configurations described herein.

The various configurations of the embodiments apply in an identical way, insofar as expedient, both to the encapsulation structure for a optoelectronic component and to the encapsulation arrangement and the method for encapsulating an optoelectronic component.

The term "layer" or "layer structure", as used herein, can denote an individual layer or a layer sequence (layer stack) composed of a plurality of thin (partial) layers. In particular, functional layers of the optoelectronic component, for example organic functional layers of an organic optoelectronic component, can be formed from a plurality of (partial) layers. However, other layers described herein can also be formed from a plurality of (partial) layers.

The terms "arranged one on top of another", "formed one on top of another" and "applied on a layer", as used herein, mean, for example, that one layer is arranged directly in direct mechanical and/or electrical contact on another layer. One layer can also be arranged indirectly on another layer in which case further layers can then be present between the layers indicated. Such layers can serve, for example, to further improve the functionality and thus the efficiency of the optoelectronic component.

The terms "arranged one above another", "formed one above another" and "applied above a layer", as used herein, mean, for example, that one layer is arranged at least indirectly on another layer. That is to say that further layers can be present between the layers indicated.

The term "adhesive layer", as used herein, can denote a layer or layer structure which includes or consists of one or a plurality of adhesive materials (e.g. adhesive). By means of the adhesive layer or the adhesive material (e.g. adhesive) of the adhesive layer, two or more elements (e.g. layers), can be fixedly connected to one another by means of adhesive. The adhesive promotion can be effected by the adhesive layer, which can be formed at least partly between the elements (e.g. layers) to be connected.

In the context of this application, a "functional layer" of an optoelectronic component can be understood to mean a layer which serves for charge transport and for light generation in the optoelectronic component.

In accordance with one configuration, the at least one functional layer of the optoelectronic component is formed as an organic functional layer.

An "organic functional layer" can contain emitter layers, for example including fluorescent and/or phosphorescent emitters.

Examples of emitter materials which can be used in the optoelectronic component in accordance with various configurations include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)-iridium III), green phosphorescent $Ir(ppy)_3$ (tris(2-phenylpyridine) iridium III), red phosphorescent Ru $(dtb\text{-}bpy)_3 \ast 2(PF_6)$ (tris[4,4'-di-tert-butyl-(2,2')-bipyridine]ruthenium (III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of wet-chemical methods such as spin coating, for example.

The emitter materials can be embedded in a matrix material in a suitable manner.

The emitter materials of the emitter layers of the optoelectronic component can be selected for example such that the optoelectronic component emits white light. The emitter layer may include a plurality of emitter materials that emit in different colors (for example blue and yellow or blue, green and red); alternatively, the emitter layer can also be constructed from a plurality of partial layers, such as a blue fluorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The optoelectronic component may generally include further organic functional layers that serve to further improve the functionality and thus the efficiency of the optoelectronic component.

By way of example, it is possible to select organic functional layers which serve to improve the functionality and the efficiency of a first electrode and/or of a second electrode and of charge carrier and exciton transport.

It should be pointed out that, in alternative embodiments, any suitable form of light emitting functional layers, for example organic functional layers, can be provided and the embodiments are not restricted to a specific type of functional layer(s).

In the context of this application, "impurities" and "contaminations" can generally be understood to mean materials, material compounds, particles, substances, etc. whose occurrence during a manufacturing process or whose presence in a processed component (device) is undesirable since they can, for example, adversely influence the manufacturing process and/or impair the functionality of the device.

In the context of this application, "chemical impurities" and "chemical contaminations" can be understood to mean chemical constituents from the environment (to put it another way, atmospheric substances) which act as impurities during the production of an optoelectronic component (e.g. an organic optoelectronic component). By way of example, "chemical impurities" can be understood to mean chemical constituents of the environment which, if they come into contact with one or a plurality of layers of an optoelectronic component (in particular with one or a plurality of functional layers of the optoelectronic component (e.g. organic functional layers in the case of an organic optoelectronic component such as e.g. an OLED)), can react with this or these layer(s) and can thereby impair or damage the functionality of the layer(s) and thus of the optoelectronic component. Examples of such harmful constituents are, in particular, water (moisture) or oxygen.

In the context of this application, a "thin-film encapsulation" can be understood to mean, for example, a layer or a layer structure which is suitable for forming a barrier against chemical impurities or atmospheric substances, in particular against water (moisture) and/or oxygen. In other words, the thin-film encapsulation is formed in such a way that atmospheric substances such as water or oxygen cannot penetrate through said thin-film encapsulation or at most very small proportions of said substances can penetrate through said thin-film encapsulation. In the case of the thin-film encapsulation, the barrier effect is substantially achieved by one or a plurality of thin layers that are part of the thin-film encapsulation. The layer or the individual layers of the thin-film encapsulation can have, for example, a thickness of less than or equal to a few 100 nm.

In accordance with one configuration, the thin-film encapsulation consists of the layer(s) responsible for the barrier effect of the thin-film encapsulation. Said layer(s) can also be designated as barrier thin-film layer(s) or barrier thin film(s).

In accordance with one configuration, the thin-film encapsulation can be formed as an individual layer (to put it another way, as a single layer).

In accordance with an alternative configuration, the thin-film encapsulation may include a plurality of partial layers formed one on top of another. In other words, in accordance with one configuration, the thin-film encapsulation can be formed as a layer stack having a plurality of partial layers (also designated as barrier thin-film layers).

The thin-film encapsulation or one or a plurality of partial layers (barrier thin-film layers) of the thin-film encapsulation can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a thin-film encapsulation having a plurality of partial layers, all the partial layers can be formed by means of an atomic layer deposition method. A layer sequence including only ALD layers can also be designated as a "nanolaminate".

In accordance with an alternative configuration, in the case of a thin-film encapsulation including a plurality of partial layers, one or a plurality of partial layers of the thin-film encapsulation can be deposited by means of a different deposition method than an atomic layer deposition method, for example by means of a chemical vapor deposition (CVD) method.

In accordance with one configuration, the thin-film encapsulation can have a layer thickness of approximately 1 nm to approximately 10 µm, for example a layer thickness of approximately 30 nm to approximately 1 µm in accordance with one configuration, for example a layer thickness of approximately 300 nm to approximately 600 nm in accordance with one configuration, for example approximately 450 nm in accordance with one configuration.

In accordance with one configuration in which the thin-film encapsulation includes a plurality of partial layers, all the partial layers can have the same layer thickness. In accordance with another configuration, the individual partial layers of the thin-film encapsulation can have different layer thicknesses. In other words, at least one of the partial layers can have a different layer thickness than one or more other partial layers.

A layer (or partial layer) of the thin-film encapsulation that is deposited by means of an atomic layer deposition (ALD) method, can have for example a layer thickness in the range of approximately 1 nm to approximately 1000 nm, for example a layer thickness of approximately 10 nm to approximately 100 nm in accordance with one configuration, for example approximately 50 nm in accordance with one configuration.

A layer (or partial layer) of the thin-film encapsulation that is deposited by means of a chemical vapor deposition method (CVD method) can have for example a layer thickness in the range of approximately 10 nm to approximately 10 µm, for example a layer thickness of approximately 30 nm to approximately 1 µm in accordance with one configuration, for example a layer thickness of approximately 100 nm to approximately 500 nm in accordance with one configuration, for example approximately 400 nm in accordance with one configuration.

The thin-film encapsulation or the individual partial layers of the thin-film encapsulation can be formed as a transparent layer in accordance with one configuration. In other words, the thin-film encapsulation (or the individual partial layers of the thin-film encapsulation) can consist of a transparent material (or a material combination that is transparent).

In the context of this application, a transparent or translucent material and a transparent layer can be understood to mean, for example, a material and a layer that are transparent or transmissive to light in the visible wavelength range. In the context of this application, a non-transparent material and a non-transparent layer can be understood to mean for example a material and a layer that are not transparent or not transmissive to light in the visible wavelength range.

By way of example, in various configurations in which the optoelectronic component is embodied as a top emitter (or as a combination of top emitter and bottom emitter), the thin-film encapsulation or the individual partial layers of the thin-film encapsulation can be formed as transparent layer(s).

In accordance with one configuration, the layer or the individual partial layers of the thin-film encapsulation can be formed as non-transparent layer(s).

The layer or the individual partial layers of the thin-film encapsulation may each include a material suitable for protecting the functional layers(s) of the optoelectronic component against harmful influences of the environment, that is to say for instance against oxygen and/or moisture.

By way of example, the thin-film encapsulation or (in the case of a layer stack having a plurality of partial layers) one or a plurality of the partial layers of the thin-film encapsulation may include or consist of one of the following materials: an oxide, a nitride or an oxynitride in crystalline or in vitreous form. The oxide, nitride or oxynitride may for example furthermore include aluminum, silicon, tin, zinc, titanium, zirconium, tantalum, niobium or hafnium. The layer or the individual partial layers may include for example silicon oxide ($SiO_x$), such as, for instance, $SiO_2$, silicon nitride ($Si_xN_y$), such as, for instance, $Si_2N_3$, aluminum oxide, for instance $Al_2O_3$, aluminum nitride, tin oxide, indium tin oxide, zinc oxide, aluminum zinc oxide, titanium oxide, zirconium oxide, hafnium oxide or tantalum oxide.

In accordance with one configuration, in the case of a thin-film encapsulation including a plurality of partial layers, all the partial layers may include or consist of the same material. In accordance with another configuration, the individual partial layers of the thin-film encapsulation may include or consist of different materials. In other words, at least one of the partial layers may include or consist of a different material than one or more other partial layers.

In the context of this application, "particle impurities" and "particle contaminations" can be understood to mean, for example, impurities as a result of microscopic solid particles, in other words impurities as a result of solid particles having dimensions (e.g. diameter) in the micrometers range, e.g. dust particles having dimensions in the micrometers range, e.g. particles having a diameter in the range of approximately 0.1 μm to approximately 100 μm, for example in the range of approximately 1 μm to approximately 10 μm. Such particle impurities can occur, for example, owing to the fact that it is not always possible to ensure hundred percent purity in the process chamber (e.g. reactor) during a component manufacturing process. Undesirable particle contamination can occur, for example, if, during the production of a layer structure having a plurality of layers, there is a relatively long period of time between the process for depositing a first layer and the process for depositing the subsequent layer. In this case, it is possible, in the time between the two deposition processes, for particles to deposit on the surface of the first deposited layer and "contaminate" the latter. Furthermore, particle contamination can for example also occur if, during a component manufacturing process, the component is transferred from one process chamber into another (reactor change).

In accordance with various embodiments, the thin-film encapsulation or at least one partial layer of the thin-film encapsulation ensures at least partial inclusion of particles or particle impurities present for example at or on the surface of a functional layer stack of an optoelectronic component.

Furthermore, in accordance with various embodiments, the adhesive layer applied on a thin-film encapsulation ensures inclusion of particles or particle impurities present at or on the surface of the thin-film encapsulation and/or a planarizing covering of the surface. In other words, by means of the adhesive layer, firstly particle impurities situated at the surface of the thin-film encapsulation can be included or enclosed, and secondly unevennesses at the surface which can be brought about by the particle impurities can be compensated for or leveled.

In accordance with one configuration, the adhesive layer includes a curable adhesive material. By way of example, the adhesive layer can consist of a curable adhesive material (e.g. a curable adhesive).

In the context of this application, a "curable adhesive material" or "curing adhesive material" can be understood to mean, for example, an adhesive material which can undergo transition or be transferred from a first state having lower mechanical hardness or strength (non-cured state) to a second state having, compared with the first state, higher mechanical hardness or strength (cured state). The transition from the first (non-cured) state to the second (cured) state can be designated as "curing".

An adhesive layer which includes or consists of a curable adhesive material can be applied in the non-cured state and can subsequently be cured or cure (for example after the cover layer has been applied).

In accordance with one configuration, the curable adhesive material of the adhesive layer is formed as UV-curing adhesive material. In other words, the curable adhesive material can cure or be cured by means of the action of UV radiation (ultraviolet radiation). The UV radiation used for curing can have for example a wavelength in the range of approximately 310 nm to approximately 430 nm in accordance with one configuration, for example in the range of approximately 360 nm to approximately 390 nm in accordance with one configuration. Furthermore, the UV radiation used can have a dose that is less than approximately 10 000 mJ/cm$^2$ in accordance with one configuration, e.g. a dose in the range of approximately 2000 mJ/cm$^2$ to approximately 8000 mJ/cm$^2$ in accordance with one configuration, e.g. a dose in the range of approximately 5000 mJ/cm$^2$ to approximately 7000 mJ/cm$^2$ in accordance with one configuration, e.g. a dose of approximately 6000 mJ/cm$^2$ in accordance with one configuration.

The UV-curing adhesive material can be chosen for example such that the parameters of the UV radiation (e.g. wavelength, dose) that are used for curing can be chosen such that possible damage to the optoelectronic component as a result of the UV radiation can be avoided.

In accordance with another configuration, the curable adhesive material of the adhesive layer can be formed as temperature-curing adhesive material. In other words, the curable adhesive material can cure or be cured by means of a thermal treatment (in other words, by means of a heat treatment or heating).

In accordance with one configuration, the curable adhesive material can be a temperature-curable adhesive material (e.g. temperature-curing adhesive) that cures at a temperature of less than approximately 150° C. The temperature used for curing can be for example approximately 10° C. to approximately 140° C. in accordance with one configuration, for example approximately 50° C. to approximately 100° C. in accordance with one configuration, for example approximately 80° C. in accordance with one configuration.

The duration of the thermal treatment can be for example approximately 1 min to approximately 300 min in accordance with one configuration, for example approximately 30 min to approximately 100 min in accordance with one configuration, for example approximately 60 min in accordance with one configuration.

One advantage of a temperature-curable adhesive material that cures at a relatively low temperature and/or already after a relatively short heat treatment duration can be seen in the fact that damage to the optoelectronic component as a result of excessively high temperatures and/or excessively long heat treatment times can be avoided. Furthermore, a low thermal budget can entail a cost saving.

In accordance with one configuration, the curable adhesive material of the adhesive layer is formed as self-curing adhesive material. In this context, a "self-curing adhesive material" can be understood to mean for example an adhesive material that cures without external action (e.g. heat treatment or UV irradiation) under normal room conditions (temperature, pressure), e.g. after a specific (for example material-dependent) time duration has elapsed. One advantage of a self-curing adhesive material can be seen in the fact that curing the adhesive material does not require for example an apparatus for heat treatment (heating) or for UV irradiation. Costs can thus be saved.

In accordance with one configuration, the adhesive layer may include or consist of, for example, one or a plurality of the following materials: epoxy adhesive, acrylic adhesive, silicone adhesive.

In accordance with various configurations, the adhesive layer is formed such that particle impurities situated at the surface of the thin-film encapsulation are at least partly enclosed by the adhesive layer or are at least partly embedded in the adhesive layer. The adhesive layer can be formed such that the particle impurities are completely embedded in the adhesive layer.

The adhesive layer can furthermore be formed such that it has a substantially plane (planar) surface. By way of example, the adhesive layer can have a plane surface over its entire lateral extent.

In accordance with one configuration, the adhesive layer has a layer thickness that is greater than or approximately equal to the diameter of the particle impurities or particles. By way of example, the adhesive layer can have a layer thickness that is greater than the average diameter of the particle impurities. The layer thickness can be for example greater than the maximum diameter of the particle impurities.

The layer thickness of the adhesive layer can illustratively be chosen such that particle impurities (to put it another way, particle contaminations) or particles possibly present at or on the surface of the thin-film encapsulation are included (in other words, enclosed) by the adhesive layer. In other words, the layer thickness of the adhesive layer can be chosen such that particle impurities present at or on the surface of the thin-film encapsulation are completely surrounded or enclosed by the adhesive material of the adhesive layer and, in particular, illustratively do not "project" from said adhesive layer.

The adhesive layer can have for example a layer thickness of approximately 1 µm to approximately 500 µm, for example approximately 10 µm to approximately 100 µm in accordance with one configuration, for example approximately 15 µm to approximately 35 µm in accordance with one configuration, for example 25 µm in accordance with one configuration.

The cover layer can also be designated as mechanical protective layer or mechanical protective film since it can serve as protection of the thin-film encapsulation and/or of the optoelectronic component against mechanical loads or damage (e.g. as a result of scratching).

In accordance with one configuration, the cover layer includes a rigid layer or is formed as a rigid layer, e.g. as a glass layer. A cover layer formed as a rigid layer can also be designated as a cover plate. A cover layer formed as a glass layer can also be designated as cover glass or cap glass.

In accordance with one alternative configuration, the cover layer includes a flexible layer or is formed as a flexible layer, for example as a foil, for example as a transparent foil, alternatively as a non-transparent foil. The cover layer may for example include a (transparent or non-transparent) heat conducting foil or be formed as such in accordance with one configuration. A cover layer formed as a heat conducting foil can serve for homogenizing and/or transporting away heat generated during the operation of the optoelectronic component (e.g. an OLED).

In accordance with another configuration, the cover layer includes a lacquer layer. The cover layer can be formed for example as a lacquer layer (e.g. as a transparent lacquer layer or as a non-transparent lacquer layer).

The lacquer layer may include or consist of a lacquer material suitable for forming a mechanical protective layer, for example a polyacrylic lacquer material, for example a polyacrylic protective lacquer (e.g. a transparent polyacrylic protective lacquer), alternatively other suitable lacquer materials or lacquers.

The cover layer can be formed as a transparent layer, alternatively as a non-transparent layer.

By way of example, in one configuration in which the optoelectronic component is embodied as a top emitter or as a combination of top emitter and bottom emitter, the cover layer can be formed as a transparent layer.

In accordance with one configuration, the cover layer has been or is laminated on the thin-film encapsulation by means of the adhesive layer. In this case, the cover layer can be for example part of a self-adhesive protective foil, e.g. a polycarbonate foil (e.g. having a layer thickness of approximately 300 µm, alternatively having a different layer thickness), with the adhesive layer (adhesive film) (e.g. having a layer thickness of approximately 25 µm, alternatively having a different layer thickness). In other words, the self-adhesive protective foil may include the adhesive layer and the cover layer.

In accordance with one configuration, the adhesive layer includes scattering particles. The scattering particles can be embedded in the adhesive layer, for example.

The scattering particles can be dispersed as volume scatterers for example in the adhesive material of the adhesive layer serving as matrix material. The scattering particles may include for example a metal oxide such as, for example, titanium oxide or aluminum oxide such as, for instance, corundum, and/or glass particles and/or plastic particles which have a different refractive index than the matrix material. Furthermore, the scattering particles can have cavities and can be embodied for example in the form of hollow plastics spheres. In this case, the scattering particles can have for example diameters or grain sizes of from less than 1 µm to an order of magnitude of 10 µm or even 100 µm.

The scattering particles can bring about, for example, an improvement in the coupling-out of light.

Furthermore, the adhesive layer can be formed such that an optical improvement can be obtained by means of cavity effects.

In accordance with another configuration, at least one additional layer is formed on or above the cover layer. A plurality of additional layers can be formed (for example one above another) on or above the cover layer.

In accordance with one configuration, the at least one additional layer includes at least one heat conducting foil. The heat conducting foil can serve for homogenizing and/or transporting away heat generated during the operation of the optoelectronic component (e.g. an OLED).

In accordance with another configuration, the at least one additional layer includes a light coupling-out layer. The light coupling-out layer may include scattering particles, for example, which can be formed for example as described above in connection with the adhesive layer.

In accordance with various configurations in which the adhesive layer includes or consists of a curable adhesive material, the adhesive layer is applied to the thin-film encapsulation in a non-cured state (e.g. in liquid form). In this case, the (as yet) uncured adhesive layer can make possible, by virtue of properties such as, for example, interfacial tension or wetting capability, layer thickness and viscosity, an inclusion of particle impurities at the surface of the thin-film encapsulation and a planarizing covering of the surface. In accordance with various configurations, the cover layer is applied on the uncured (or not fully cured) adhesive layer. In accordance with various configurations, the adhesive layer is cured after the cover layer has been applied. The adhesive layer can be cured for example by means of irradiation with UV light (with the use of a UV-curing material for the adhesive layer). Alternatively, the adhesive layer can be cured by means of heat treatment (heating) with a predefinable temperature (with the use of a temperature-curing material for the adhesive layer). With the use of a self-curing adhesive material, the curing can be effected without external influence such as e.g. UV radiation or heat treatment.

Particle impurities can be or have been embedded in the (cured) adhesive layer of the encapsulation structure. It is thereby possible to prevent the particles from being "impressed" into an optoelectronic component (e.g. OLED), to be encapsulated by means of the encapsulation structure, and so damage to the optoelectronic component as a result of the particles can be avoided.

In accordance with one configuration, the optoelectronic component is formed or designed as an organic optoelectronic component. The optoelectronic component can be formed, for example, without being restricted thereto, as an organic light emitting diode (OLED), as an organic solar cell or photovoltaic cell (OPV), as an organic phototransistor or the like.

The optoelectronic component may include a substrate.

A "substrate", as used herein, may include, for example, a substrate usually used for an optoelectronic component. The substrate can be a transparent substrate. However, the substrate can also be a non-transparent substrate. By way of example, the substrate may include glass, quartz, sapphire, plastic foil(s), metal, metal foil(s), silicon wafers or some other suitable substrate material. In various configurations, substrate is understood to mean the layer on which all other layers are subsequently applied during the production of the optoelectronic component. Such subsequent layers can be layers required for the emission of radiation e.g. in the case of a optoelectronic component or a radiation emitting device.

In accordance with one configuration, the substrate is formed as a rigid substrate. By way of example, the substrate can be formed as a glass substrate.

In accordance with one configuration, the substrate is formed as a flexible (in other words pliable) substrate. By way of example, the substrate can be formed as a foil substrate, e.g. as a steel foil substrate or as a polymer foil substrate in accordance with one configuration.

The substrate can be formed as a transparent substrate (e.g. as a transparent foil or as a glass substrate), alternatively as a non-transparent substrate (e.g. as a silicon wafer in accordance with one configuration).

In accordance with one configuration, a first electrode (first electrical contact) is formed during the substrate and the least one functional layer. The first electrode can be applied on or above the substrate, and the at least one functional layer can be applied on or above the first electrode. The first electrode can also be designated as bottom electrode or as bottom contact. Alternatively, the first electrode can also be designated as substrate-side electrode or substrate-side contact.

The first electrode can be an anode, alternatively a cathode.

In accordance with one configuration, a second electrode is formed between the at least one functional layer and the thin-film encapsulation. The second electrode can be applied on or above the at least one functional layer, and the thin-film encapsulation can be applied on or above the second electrode. The second electrode can also be designated as top electrode or as top contact. Alternatively, the second electrode can also be designated as top-side electrode or top-side contact.

The second electrode can be a cathode (e.g. if the first electrode is an anode), alternatively an anode (e.g. if the first electrode is a cathode).

Electrical contact can be made with the first electrode and the second electrode in a suitable manner.

The first electrode and/or the second electrode can be formed in a transparent fashion. Alternatively, the first electrode and/or the second electrode can be formed in a non-transparent fashion.

By way of example, in accordance with one configuration in which the optoelectronic component is embodied as a bottom emitter, the first electrode (bottom electrode), can be formed in a transparent fashion at the second electrode (top electrode) can be formed in a non-transparent fashion. In this case, the second electrode can be formed as a reflective electrode (reflective contact), in other words as an electrode which substantially or completely reflects the radiation emitted by the at least one functional layer.

In accordance with one configuration in which the optoelectronic component is embodied as a top emitter, the second electrode (top electrode) can be formed in a transparent fashion and the first electrode (bottom electrode) can be formed in a non-transparent fashion. In this case, the first electrode can be formed as a reflective electrode (reflective contact), in other words as an electrode which substantially or completely reflects the radiation emitted by the at least one functional layer.

In accordance with one configuration in which the optoelectronic component is embodied as a combination of top emitter and bottom emitter, the first electrode and the second electrode can be formed in each case as a transparent electrode.

The first electrode and/or the second electrode can have been or be applied by means of a deposition method, for example. In accordance with one configuration, the first electrode and/or the second electrode can be applied by means of sputtering or by means of thermal evaporation. Alternatively, other suitable methods can be used for applying the first and/or second electrode.

In accordance with various configurations, the first electrode and/or the second electrode can have a layer thickness in a range of approximately 5 nm to a few μm, for example a layer thickness in a range of approximately 100 nm to approximately 200 nm. In accordance with alternative configurations, the first electrode and/or the second electrode can have a different layer thickness.

It should be noted in this context that the layer thickness of the electrodes can be dependent on the choice of electrode material. Typical layer thicknesses for electrodes composed of TCO materials (TCO: transparent conductive oxide, e.g. ITO (indium tin oxide)) can be for example in the range of approximately 50 nm to approximately 200 nm. Transparent electrodes based on thin metal layers can have for example layer thicknesses in the range of approximately 10 nm to approximately 30 nm. For reflective metal electrodes, the layer thickness can be for example in the range of approximately 50 nm to 200 nm, but alternatively can also be up to several μm. To summarize, it can be stated that different electrode approaches can necessitate different electrode layer thicknesses.

The first electrode and/or the second electrode may be formed from a material or include a material which is selected from metals such as aluminum, barium, indium, silver, gold, magnesium, calcium and lithium and combinations thereof or a compound thereof, in particular an alloy, and transparent conductive oxides, such as, for example, metal oxides, such as zinc oxide, tin oxide, cadmium oxide, titanium oxide, indium oxide or indium-doped tin oxide (ITO), aluminum-doped zinc oxide (AZO), $Zn_2SnO_4$, $CdSnO_3$, $ZnSnO_3$, $MgIn_2O_4$, $GaInO_3$, $Zn_2In_2O_5$ or $In_4Sn_3O_2$ or mixtures of different transparent conductive oxides. In accordance with other configurations, the first electrode and/or the second electrode may include or consist of some other suitable material.

In accordance with various configurations, the optoelectronic component (e.g. organic optoelectronic component such as e.g. OLED), be embodied as a "bottom emitter".

The term "bottom emitter" or "bottom emitting optoelectronic component" as used herein, denotes an embodiment which is embodied as transparent toward the substrate side of the optoelectronic component. By way of example, for this purpose at least the substrate and layers formed between the substrate and the at least one functional layer (e.g. an electrode (bottom electrode) formed between substrate and functional layer(s)) can be embodied in a transparent fashion. Accordingly, an optoelectronic component embodied as a bottom emitter can emit radiation generated for example in the functional layers (e.g. organic functional layers in the case of an organic optoelectronic component such as e.g. an OLED) on the substrate side of the optoelectronic component.

As an alternative or in addition thereto, the optoelectronic component can be embodied as a "top emitter" in accordance with various embodiments.

The term "top emitter" or "top emitting optoelectronic component", as used herein, denotes for example an embodiment which is embodied as transparent toward that side (to put it another way, the top side) of the optoelectronic component that faces away from the substrate. In particular, for this purpose the layers formed on or above the at least one functional layer of the optoelectronic component (e.g. electrode (top electrode) formed between functional layer(s) and thin-film encapsulation, thin-film encapsulation, adhesive layer, cover layer) can be embodied in a transparent fashion. Accordingly, a optoelectronic component embodied as a top emitter can emit radiation generated for example in the functional layers (e.g. organic functional layers in the case of an organic optoelectronic component such as e.g. an OLED) on the top side of the optoelectronic component.

An optoelectronic component configured as a top emitter in accordance with various embodiments can advantageously have a high coupling-out of light and a very small angle dependence of the radiance.

An optoelectronic component in accordance with various embodiments can advantageously be used for lighting systems, such as room luminaires, for example.

A combination of bottom emitter and top emitter is likewise provided in various embodiments. In one such embodiment, the optoelectronic component is generally able to emit the light generated in the functional layers (e.g. the organic functional layers in the case of an organic optoelectronic component such as e.g. an OLED) in both directions—that is to say both toward the substrate side and toward the top side.

In accordance with another embodiment, a third electrode is provided in the optoelectronic component, said third electrode being arranged between the first electrode and the second electrode.

The third electrode can function as an intermediate contact. It can serve to increase charge transport through the layers of the optoelectronic component and thus to improve the efficiency of the optoelectronic component. The third electrode can be configured as an ambipolar layer. It can be configured as cathode or anode.

In the same way as the first electrode and the second electrode, electrical contact can have been or be suitably made with the third electrode in accordance with various embodiments.

In one development of the optoelectronic component, an emitter layer and one or a plurality of further organic functional layers are contained as organic functional layers. The further organic functional layers can be selected from the group consisting of hole injection layers, hole transport layers, hole blocking layers, electron injection layers, electron transport layers and electron blocking layers.

Suitable functional layers and suitable organic functional layers are known per se to the person skilled in the art. The (organic) functional layers can preferably be applied by means of thermal evaporation. The further (organic) functional layers can advantageously improve the functionality and/or efficiency of the optoelectronic component.

In accordance with various configurations, a process for encapsulating a optoelectronic component is provided, which process includes: (1) applying a thin-film encapsulation (which can have one or a plurality of barrier thin-film layers) as protection against ingress of harmful chemical constituents from the environment (e.g. water or oxygen) into the optoelectronic component, (2) forming an adhesive layer on the thin-film encapsulation (e.g. directly on the thin-film encapsulation). In this case, it is possible to use materials and processes which minimize the particle loading on the surface or make particles harmless by enclosure. On the adhesive layer, (3) a cover layer (mechanical protective layer) is formed (e.g. in accordance with one configuration the cover layer is laminated on the thin-film encapsulation using the adhesive layer previously applied on the cover layer (e.g. on the underside of the cover layer), such that the adhesive layer is formed between the thin-film encapsulation and the cover layer and illustratively connects the thin-film encapsulation and the cover layer to one another).

BRIEF DESCRIPTION OF THE DRAWINGS

In the drawings, like reference characters generally refer to the same parts throughout the different views.

The drawings are not necessarily to scale, emphasis instead generally being replaced upon illustrating the principles of the disclosure. In the following description, various embodiments of the disclosure are described with reference to the following drawings, in which:

FIG. 5 shows a method for encapsulating a optoelectronic component in accordance with a further embodiment;

FIG. 6 shows an encapsulation arrangement in accordance with a further embodiment;

FIG. 7A shows one excerpt from the encapsulation arrangement shown in FIG. 6,

FIG. 7B shows another excerpt from the encapsulation arrangement shown in FIG. 6;

FIG. 8 shows an encapsulation arrangement in accordance with a further embodiment;

FIG. 9 shows an encapsulation arrangement in accordance with a further embodiment;

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling.

In the figures, identical or similar elements are provided with identical reference signs, insofar as this is expedient.

Figure 3:
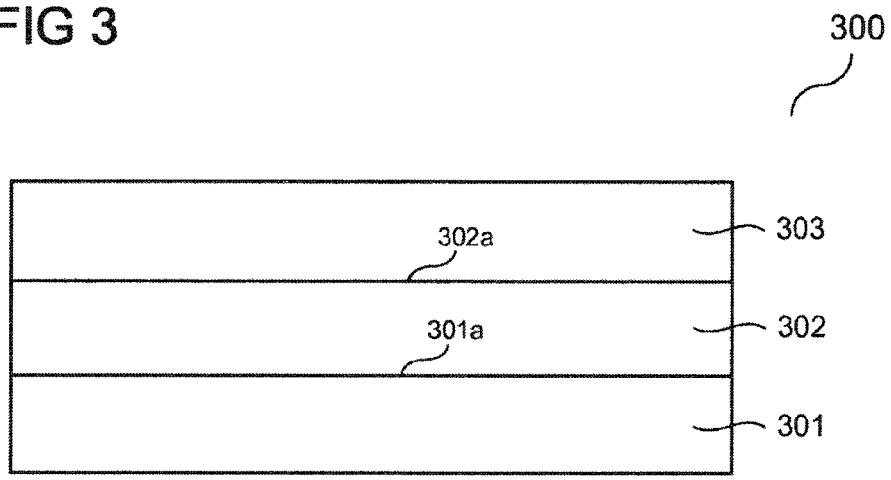
FIG. 3 shows an encapsulation structure for an optoelectronic component in accordance with one embodiment.

FIG. 3 shows an encapsulation structure 300 for a optoelectronic component in accordance with one embodiment.

In accordance with various configurations, the encapsulation structure 300 may include a thin-film encapsulation 301 for protecting an optoelectronic component against chemical impurities. The thin-film encapsulation 301 may include one or a plurality of thin layers (also designated as barrier thin-film layers) and can furthermore be formed in accordance with one or a plurality of configurations described herein.

In accordance with various configurations, the encapsulation structure 300 may furthermore include an adhesive layer 302 applied on the thin-film encapsulation 301. The adhesive layer 302 may include or consist of an adhesive material and can furthermore be formed in accordance with one or a plurality of configurations described herein.

In accordance with various configurations, the encapsulation structure 300 may furthermore include a cover layer 303, applied on the adhesive layer 302, for protecting the thin-film encapsulation 301 against mechanical damage. The cover layer 303 can be formed in accordance with one or a plurality of configurations described herein, for example as a rigid cover layer (e.g. glass cover layer) or as a flexible cover layer (e.g. as a foil), and/or as a transparent cover layer (e.g. cover glass or transparent foil), or as a non-transparent cover layer (e.g. non-transparent metal foil), etc. In accordance with one configuration, the cover layer 303 can be, for example, part of a self-adhesive foil which is applied (e.g. laminated) on the thin-film encapsulation 301 by means of the adhesive layer 302.

In accordance with various configurations, the adhesive layer 302 may include a curable adhesive material, e.g. a UV-curing adhesive. The adhesive layer 302 can be applied in the non-cured (e.g. liquid) state and can subsequently cure or be cured (e.g. after the cover layer 303 has been applied).

The adhesive layer 302 can be designed or formed such that particle impurities at the top side 301a of the thin-film encapsulation 301 are included by the adhesive layer 302 and the applied adhesive layer 302 has a substantially planar (upper) surface 302a. By including the particles in the adhesive layer 302, it is possible, for example, to prevent the particles from being impressed into underlying layers, in particular the thin-film encapsulation 301 and/or underlying layers (e.g. functional layers of an optoelectronic component (e.g. OLED) to be encapsulated), and damaging them.

Figure 4:
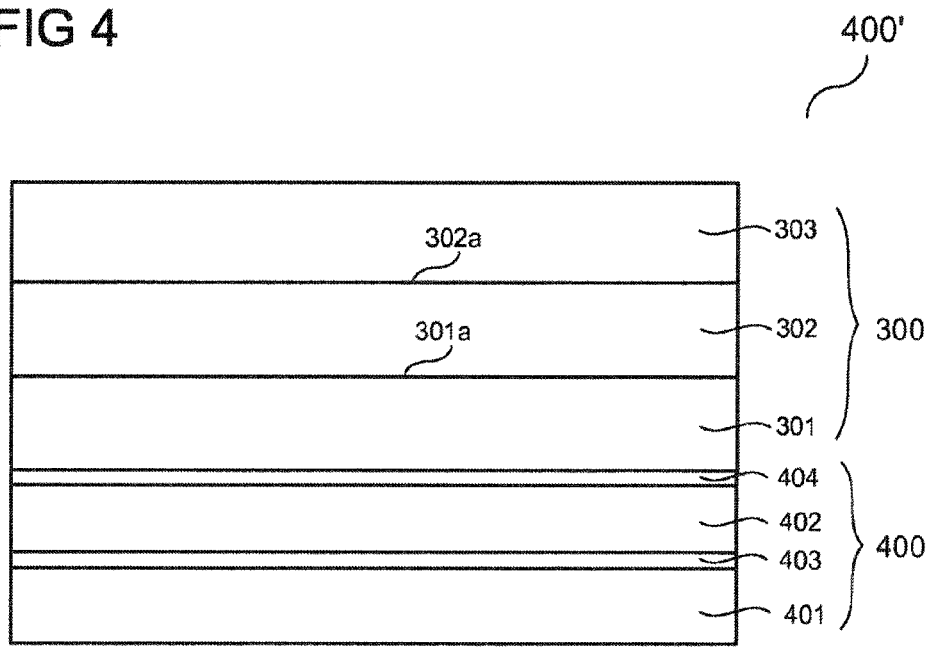
FIG. 4 shows an encapsulation arrangement in accordance with a further embodiment.

FIG. 4 shows an encapsulating arrangement 400' in accordance with a further embodiment.

In accordance with various configurations, the encapsulation arrangement 400' includes a optoelectronic component 400 and an encapsulation structure 300. The encapsulation structure 300 can be formed in accordance with one or a plurality of the configurations described herein.

In accordance with various configurations, the optoelectronic component 400 may include at least one functional layer 402, as shown in FIG. 4. The at least one functional layer 402 can be formed as an individual layer (as shown in FIG. 4) or as a layer stack (also designated as functional layer stack) having a plurality of partial layers. The at least one functional layer 402 can furthermore be formed in accordance with one or a plurality of the configurations described herein.

In accordance with various configurations, the encapsulation structure 300 can be formed on or above the at least one functional layer 402 of the optoelectronic component 400.

In accordance with various configurations, the optoelectronic component 400 may include one or a plurality of additional layers above and/or below the at least one functional layer 402.

In accordance with various configurations, the optoelectronic component 400 may include a substrate 401. The substrate 401 can be formed in accordance with one or a plurality of the configurations described herein.

In accordance with various configurations, the optoelectronic component 400 may furthermore include a first electrode 403. In accordance with one configuration, the first electrode 403 can be formed between the substrate 401 and the at least one functional layer 402 (e.g. on the underside of the at least one functional layer 402), as shown in FIG. 4. The first electrode 403 can furthermore be formed in accordance with one or a plurality of the configurations described herein.

In accordance with various configurations, the optoelectronic component 400 may furthermore include a second electrode 404. In accordance with one configuration, the second electrode 404 can be formed between the at least one functional layer 402 and the thin-film encapsulation 301 (e.g. on the top side of the at least one functional layer 402), as shown in FIG. 4. The thin-film encapsulation 301 can be formed for example on the second electrode 404, as shown in FIG. 4. The second electrode 404 can furthermore be formed in accordance with one or a plurality of the configurations described herein.

The optoelectronic component 400 can be formed in accordance with one or a plurality of the configurations described herein, for example as an organic optoelectronic component such as e.g. as an OLED, for example as a top emitter or as a bottom emitter or as a combination of top emitter and bottom emitter, in accordance with one or a plurality of the configurations described herein.

FIG. 5 shows a flow chart 500 illustrating a method for encapsulating a optoelectronic component in accordance with a further embodiment.

In 502, a thin-film encapsulation is formed on or above an optoelectronic component (e.g. on or above at least one functional layer of the optoelectronic component), in order to protect the optoelectronic component against chemical impurities. The thin-film encapsulation can have been or be designed or formed in accordance with one or a plurality of configurations described herein.

In 504, an adhesive layer is formed on the thin-film encapsulation. The adhesive layer can have been or be designed or formed in accordance with one or a plurality of configurations described herein.

In 506, a cover layer is formed on the adhesive layer in order to protect the thin-film encapsulation and/or the optoelectronic component against mechanical damage. The cover layer can have been or be designed or formed in accordance with one or a plurality of configurations described herein.

By way of example, in accordance with one configuration, the adhesive layer can be applied to a cover layer to be applied (e.g. glass to be applied) (e.g. on the underside of the cover layer), and the cover layer with the adhesive layer applied thereto can subsequently be applied on the thin-film encapsulation, such that the adhesive layer is formed between the thin-film encapsulation and the cover layer. Illustratively, in accordance with one configuration, the cover layer can be laminated onto the thin-film encapsulation with the aid of the adhesive layer applied on the cover layer.

In accordance with another configuration, the adhesive layer can be applied (directly) on the thin-film encapsulation, and the cover layer can subsequently be applied on the adhesive layer.

In accordance with yet another configuration, before the cover layer is connected to the thin-film encapsulation, the adhesive layer can be applied partly on the thin-film encapsulation and partly on the cover layer.

FIG. 6 shows an encapsulation arrangement 600' in accordance with a further embodiment.

The encapsulation arrangement 600' includes an optoelectronic component 600 and an encapsulation structure 300 formed on the optoelectronic component 600.

The optoelectronic component 600 is formed as an organic light emitting diode (OLED) and includes a substrate 601 and a layer stack 610 formed on the substrate 601. The layer stack 610 can also be designated as an OLED stack. In accordance with alternative configurations, the optoelectronic component 600 can be formed as a different optoelectronic component (e.g. a different organic optoelectronic component) than an OLED, the following description of the construction of the encapsulation arrangement 600' also being analogously applicable in this case.

In accordance with the embodiment shown, the substrate 601 is formed as a glass substrate (also designated as substrate glass). In accordance with alternative configurations, other substrates can be used, e.g. foil substrates.

The OLED stack 610 may include one or a plurality of organic functional layers (e.g. a functional layer stack), which can be formed one on top of another or one above another. Furthermore, in accordance with various configurations, the OLED stack 610 may include a first electrode and a second electrode, wherein the first electrode can be formed between the substrate 601 and the organic functional layer(s) and the second electrode can be formed between the organic functional layer(s) and the encapsulation structure 300.

In accordance with various configurations, the optoelectronic component 600 can additionally have one or a plurality of electrical contacts (not shown in FIG. 6) for making electrical contact with the OLED stack 610, e.g. for making electrical contact with the first electrode and the second electrode of the OLED stack 610.

The encapsulation structure 300 includes a thin-film encapsulation 301 formed on the OLED stack 610 and on the substrate 601. In accordance with the embodiment shown, the thin-film encapsulation 301 is formed on the top side 610a and side surfaces 610b of the OLED stack 610 in such a way that the OLED stack 610 is encapsulated by the thin-film encapsulation 301.

In accordance with the embodiment shown, the thin-film encapsulation 301 includes a first barrier thin-film layer 311 and a second barrier thin-film layer 312 formed on the first barrier thin-film layer 311, as shown in FIG. 7A and FIG. 7B, which show a first excerpt 650 and a second excerpt 655, respectively, from the encapsulation arrangement 600' shown in FIG. 6.

In accordance with the embodiment shown, the first barrier thin-film layer 311 is formed as a silicon nitride layer formed by means of a chemical vapor deposition (CVD) method, e.g. by means of a plasma enhanced chemical vapor deposition (PECVD) method, and can have for example a layer thickness of a few hundred nanometers, e.g. approximately 400 nm in accordance with one configuration. The second barrier thin-film layer 312 is formed as an aluminum oxide layer formed by means of an atomic layer deposition (ALD) method and can have for example a layer thickness of a few tens of nanometers, e.g. approximately 50 nm in accordance with one configuration.

Illustratively, the thin-film encapsulation 301 in accordance with the embodiment shown includes a thick CVD layer (first barrier thin-film layer 311) and, formed thereon, a thinner ALD layer (second barrier thin-film layer 312) compared with the CVD layer 311.

In accordance with alternative configurations, the first barrier thin-film layer 311 and/or the second barrier thin-film layer 312 can be formed by means of other deposition methods and/or may include other materials and/or can have other layer thicknesses. By way of example, the first barrier thin-film layer 311 can be formed by means of ALD and/or or the second barrier thin-film layer 312 can be formed by means of CVD. Furthermore, in addition to the first barrier thin-film layer 311 and the second barrier thin-film layer 312, additional barrier thin-film layers can be provided, which can be formed for example by means of CVD and/or ALD. Generally, the thin-film encapsulation 301 may include a layer stack having an arbitrary number of partial layers (barrier thin-film layers), wherein each of the partial layers of the layer stack (independently of the other partial layers) can optionally be formed as a CVD layer or as an ALD layer. In other words, the layer stack can have an arbitrary sequence of CVD layers and/or ALD layers.

The encapsulation structure 300 furthermore includes an adhesive layer 302 formed on the thin-film encapsulation 301.

The adhesive layer 302 can have for example a thickness in the micrometers range, for example a layer thickness of a few tens of micrometers, for example approximately 25 μm. Alternatively, the adhesive layer 302 can have a different value of the layer thickness.

The adhesive layer 302 may include for example a curable material (e.g. a UV-curing adhesive) and can have been applied on the thin-film encapsulation 301 in the non-cured (e.g. liquid) state and subsequently (e.g. after a cover layer 303 of the encapsulation structure 300 has been applied) have been cured (e.g. by means of UV radiation in the case of a UV-curing adhesive).

The encapsulation structure 300 furthermore includes a cover layer 303 formed on the adhesive layer 302. In accordance with the embodiment shown, the cover layer 303 is formed as a glass layer, in other words as encapsulation glass.

The cover layer 303 or the encapsulation glass 303 can have been adhesively bonded onto the thin-film encapsulation 301 by means of the adhesive layer 302. By way of example, in accordance with one configuration, the adhesive layer 302 can have been applied on the underside 303b of the cover layer 303, and the cover layer 303 can have been laminated onto the thin-film encapsulation 301 with the aid of the adhesive layer 302 applied on said cover layer. In accordance with another configuration, the adhesive layer can have been applied on the top side 301a of the thin-film encapsulation 301, and the cover layer 303 can subsequently have been applied on the adhesive layer 302. In accordance with yet another configuration, it is also possible to apply the adhesive layer 302 partly on the top side 301a of the thin-film encapsulation 301 and partly on the underside 303b of the cover layer 303.

Figure 1:
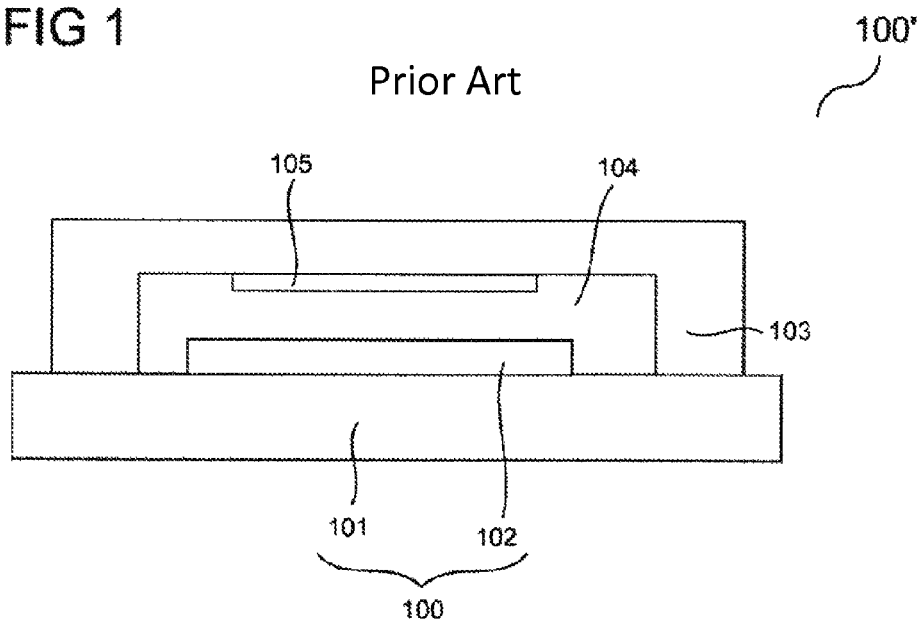
FIG. 1 shows an arrangement including an organic light emitting diode (OLED) and conventional encapsulation by means of a glass cavity in accordance with one example.
Figure 2:
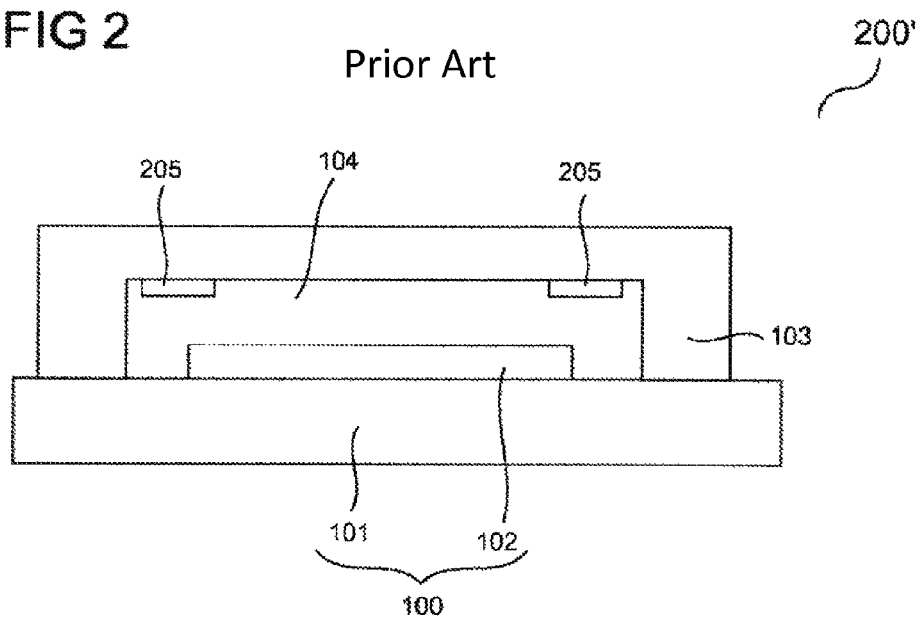
FIG. 2 shows an arrangement including an organic light emitting diode (OLED) and conventional encapsulation by means of a glass cavity in accordance with another example.

In comparison with a conventional encapsulation having a glass cavity (cf. for example FIG. 1 and FIG. 2), in the case of the encapsulation structure 300 shown in FIG. 6, no cavity is formed between the OLED stack 610 and the encapsulation glass 303. As a result, it is possible to prevent, for example, the cover glass from pressing onto the OLED stack 610, as can occur in the case of a conventional cavity encapsulation (in particular in the case of large cavities), such that resultant damage to the OLED 600 can be avoided.

As illustrated in the excerpts 650, 655 from the encapsulation arrangement 600' that are shown in FIG. 7A and FIG. 7B, the thick CVD layer (first barrier thin-film layer 311) and the adhesive layer 302 can in each case be used for embedding particles or particle impurities 710a, 710b, 710c, 710d.

The first excerpt 650 from the encapsulation arrangement 600' as shown in FIG. 7A shows that a first particle 710a, which is situated or deposited at the top side 610a of the OLED stack 610, is embedded by the first barrier thin-film layer 311, and that a second particle 710b, which is situated or deposited at the top side 301a of the thin-film encapsulation 301, is embedded by the adhesive layer 302.

The first barrier thin-film layer 311 can have a thickness that is greater than the diameter of the first particle 710a, and the adhesive layer 302 can have a thickness that is greater than the diameter of the second particle 710b, as shown in FIG. 7A. Generally, the layer thicknesses of the first barrier thin-film layer 311 and/or of the adhesive layer 302 can be chosen such that possible particle impurities at the surface of the OLED 600 and/or at the surface of the thin-film encapsulation 301 are enclosed (e.g. completely enclosed) by means of the first barrier thin-film layer 311 and/or the adhesive layer 302 or are embedded therein. By way of example, the layer thicknesses of the first barrier thin-film layer 311 and/or of the adhesive layer 302 can be chosen such that they are greater than or approximately equal to the average diameter of the particle impurities that occur. In accordance with one configuration, the layer thicknesses of the first barrier thin-film layer 311 and/or of the adhesive layer 302 can be chosen, for example, such that they are greater than the maximum of the diameters of all particle impurities that occur.

It should be noted in this connection that, instead of or in addition to the first barrier thin-film layer 311, other barrier thin-film layers (e.g. the second barrier thin-film layer 312 and/or additional barrier thin-film layers (if provided)) of the thin-film encapsulation 301 can also be formed such that they have a layer thickness which suffices to be able to embed particle impurities at least partly (e.g. completely in accordance with various configurations) in the respective barrier thin-film layer.

By means of embedding particle impurities or particles (e.g. the particles 710a, 710b) in the thin-film encapsulation 301 (e.g. in the first barrier thin-film layer 311 and the adhesive layer 302 (as shown), alternatively or additionally in other partial layers of the thin-film encapsulation 301 (if provided)), it is possible to prevent the particles from being impressed into the OLED stack 610 or the OLED 600 and thus to reduce or completely avoid mechanical loading of the OLED 600 by particles and hence to prevent damage to the OLED.

It should be noted in this connection that the illustration shown in FIG. 7A with only two particle impurities 710a and 710b is purely exemplary in character, and that more than two particles can occur and can be embedded in the thin-film encapsulation 301 (e.g. the first barrier thin-film layer 311) and/or the adhesive layer 302.

Furthermore, as is evident from the second excerpt 655 from the encapsulation arrangement 600' as shown in FIG. 7B, particle impurities that occur in a region of the thin-film encapsulation 301 and/or of the adhesive layer 302 which is situated laterally alongside the OLED stack 610 can be embedded in the same way by means of the thin-film encapsulation 301 (e.g. the first barrier thin-film layer 311) and/or the adhesive layer 302.

The second excerpt 655 from the encapsulation arrangement 655 as shown in FIG. 7B shows by way of example a third particle 710c, which is situated or has deposited at the top side 601a of the substrate 601 laterally alongside the OLED stack 610 and is embedded in the first barrier thin-film layer 311, and a fourth particle 710d, which is situated or has deposited at the top side 301a of the thin-film encapsulation 301 laterally alongside the OLED stack 610 and is embedded in the adhesive layer 302. Here, too, it goes without saying that, besides the two particles 710c, 710d shown, additional particles can occur and can be embedded in the thin-film encapsulation 301 and/or the adhesive layer 302.

FIG. 8 shows an encapsulation arrangement 800' in accordance with a further embodiment.

The encapsulation arrangement 800' differs from the encapsulation arrangement 600' shown in FIG. 6 substantially in that coupling-out structures 820a, 820b are provided, which serve for improving the light coupling-out of the light emitted by the OLED 600 (or the functional layer or layers of the OLED stack 610). In accordance with the embodiment shown, a first coupling-out structure 820a is formed on the top side 303a of the cover layer 303 and a second coupling-out structure 820b is formed on the underside 601b of the substrate 601a.

It is possible to utilize diverse coupling-out structures in both directions. In accordance with various configurations, by way of example, the first coupling-out structure 820a and/or the second coupling-out structure 820b can each have one or a plurality of coupling-out layers. Furthermore, in accordance with one configuration, one or a plurality of the coupling-out layers may include scattering particles (e.g. metal oxide particles).

In accordance with alternative configurations, it is also possible for only one coupling-out structure to be provided, for example the first coupling-out structure 820a at the surface 303a of the cover layer 303 (for example in the case of an OLED 600 formed as a (pure) top emitter) or the second coupling-out structure 820b at the underside 601b of the substrate 601 (for example in the case of an OLED 600 formed as a (pure) bottom emitter).

FIG. 9 shows an encapsulation arrangement 900' in accordance with a further embodiment.

The encapsulation arrangement 900' differs from the encapsulation arrangement 600' shown in FIG. 6 substantially in that a heat conducting foil 920 is provided for homogenizing the heat or transporting away the heat generated during the operation of the OLED 600. In accordance with the embodiment shown, the heat conducting foil 920 is applied (e.g. adhesively bonded) on the cover layer 303 of the encapsulation structure 300. In accordance with an alternative configuration, a plurality of heat conducting foils can be provided.

The heat conducting foil 920 (or the heat conducting foils) may include or consist of, for example, a non-transparent material (e.g. in the case of an OLED 600 formed as a (pure) bottom emitter. Alternatively, the heat conducting foil 920 (or the heat conducting foils) may include or consist of a transparent material (e.g. in the case of an OLED 600 formed as a (pure) top emitter or as a combined top/bottom emitter).

Figure 10:
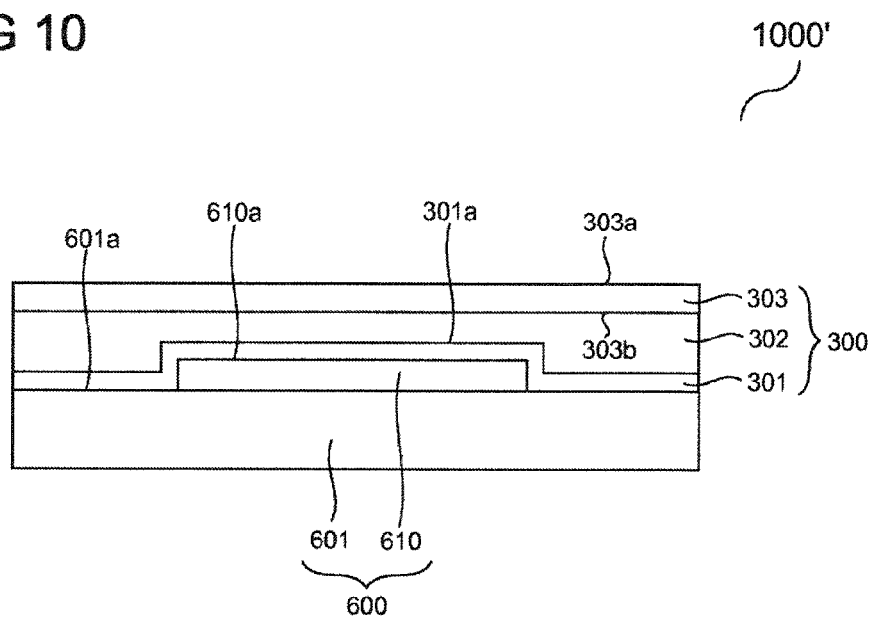
FIG. 10 shows an encapsulation arrangement in accordance with a further embodiment.

FIG. 10 shows an encapsulation arrangement 1000' in accordance with a further embodiment.

The encapsulation arrangement 1000' differs from the encapsulation arrangement 600' shown in FIG. 6 substantially in that the cover layer 303 of the encapsulation structure 300 is formed as a foil (e.g. as a heat conducting foil in accordance with one configuration). In accordance with alternative configurations, the cover layer 303 can also be formed as a lacquer layer (for example as a polyacrylic protective lacquer).

In accordance with other configurations, individual features (e.g. layers) of the embodiments shown in FIGS. 6 to 10 can be combined with one another or the construction can be varied arbitrarily by omitting individual layers or supplementing additional layers.

In accordance with various embodiments, an encapsulation construction and method for encapsulation for an optoelectronic component, for example an organic optoelectronic component such as e.g. an OLED, are provided which firstly ensure that the optoelectronic component is hermetically sealed against air and is protected against mechanical damage (such as e.g. scratches) and secondly are less expensive and more variable than conventional encapsulations by means of a second glass substrate with cavity (cavity encapsulation).

The construction of an encapsulation structure and process for encapsulating an optoelectronic component in accordance with various configurations, as described herein, are particularly suitable for example for encapsulating and protecting flexible optoelectronic components, for example flexible organic optoelectronic components such as e.g. flexible OLEDs, since they make it possible, for example, to use commercial self-adhesive foils as the topmost protective layer (the cover layer).

By means of the encapsulation structure and the method for encapsulation in accordance with various embodiments, as described herein, the occurrence of lamination-governed defects during the encapsulation and packaging of an optoelectronic component (for example an organic optoelectronic component such as e.g. an OLED) can be reduced or prevented. It is thereby possible to increase for example the yield in the packaging of an optoelectronic component.

Effects of the encapsulation structure described herein include, inter alia:

besides the function of coupling out light and protecting the optoelectronic component (e.g. OLED) against moisture, the adhesive layer or the adhesive and/or the thin-film encapsulation can also serve for covering particles or particle impurities present (see e.g. FIG. 7A and FIG. 7B);

the encapsulation structure can also be used for transparent OLEDs (with the possibility of influencing for example the coupling-out of light in a targeted manner via the thin-film encapsulation or via additional foils/coupling-out structures on both sides) (see e.g. FIG. 8);

the encapsulation structure affords diverse possibilities for improving the coupling-out of heat, e.g. by means of heat conducting foils (see e.g. FIG. 9);

in accordance with various configurations, instead of an encapsulation glass it is possible to use a different cover layer (e.g. foil or lacquer layer) (see e.g. FIG. 10);

in the case of a conventional encapsulation by means of a glass cavity (see e.g. FIG. 1 and FIG. 2), the cap glass can press onto the OLED layer stack in the case of large cavities/OLEDs (no stability of the cavity); in the case of the encapsulation structure without a cavity in accordance with various embodiments, as described herein, the cap glass is prevented from pressing onto the OLED layer stack, and this prevents possible damage to the OLED as a result of the cap glass.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An encapsulation structure for an optoelectronic component, comprising:
    a thin-film encapsulation for protecting the optoelectronic component against chemical impurities;
    an adhesive layer formed on the thin-film encapsulation, wherein the adhesive layer is formed such that particle impurities situated at the surface of the thin-film encapsulation are at least partly enclosed by the adhesive layer; and
    a cover layer formed on the adhesive layer and serving for protecting the thin-film encapsulation and/or the optoelectronic component against mechanical damage, wherein the cover layer comprises a heat conducting foil or a lacquer layer comprising a polyacrylic protective lacquer.

2. The encapsulation structure as claimed in claim 1, wherein the adhesive layer comprises a curable adhesive material.

3. The encapsulation structure as claimed in claim 2, wherein the curable adhesive material is formed as UV-curing adhesive material.

4. The encapsulation structure as claimed in claim 1, wherein the adhesive layer is formed such that the particle impurities are completely embedded in the adhesive layer.

5. The encapsulation structure as claimed in claim 1, wherein the adhesive layer has a layer thickness of approximately 1 μm to approximately 500 μm.

6. The encapsulation structure as claimed in claim 5, wherein the adhesive layer has a layer thickness of approximately 10 μm to approximately 100 μm.

7. The encapsulation structure as claimed in claim 1, wherein the cover layer comprises a glass layer.

8. The encapsulation structure as claimed in claim 1, wherein a heat conducting foil is applied on or above the cover layer.

9. The encapsulation structure as claimed in claim 1, wherein at least one light coupling-out layer is applied on or above the cover layer.

10. The encapsulation structure as claimed in claim 1, wherein the thin-film encapsulation comprises a layer stack comprising at least one first bather thin-film layer and a second bather thin-film layer formed on the first bather thin-film layer.

11. The encapsulation structure as claimed in claim 1, wherein the adhesive layer comprises scattering particles embedded in the adhesive layer.

12. An encapsulation arrangement, comprising:
an optoelectronic component having at least one functional layer;
an encapsulation structure being formed on or above the at least one functional layer, the encapsulation structure comprising:
  a thin-film encapsulation for protecting the optoelectronic component against chemical impurities;
  an adhesive layer formed on the thin-film encapsulation, wherein the adhesive layer is formed such that particle impurities situated at the surface of the thin-film encapsulation are at least partly enclosed by the adhesive layer; and
  a cover layer formed on the adhesive layer and serving for protecting the thin-film encapsulation and/or the optoelectronic component against mechanical damage, wherein the cover layer comprises a heat conducting foil or a lacquer layer comprising a polyacrylic protective lacquer.

13. The encapsulation arrangement as claimed in claim 12, wherein the optoelectronic component is an organic optoelectronic component.

* * * * *

UNITED STATES PATENT AND TRADEMARK OFFICE
CERTIFICATE OF CORRECTION

PATENT NO.        : 9,172,057 B2                          Page 1 of 1
APPLICATION NO.   : 14/129997
DATED             : October 27, 2015
INVENTOR(S)       : Richard Baisl et al.

It is certified that error appears in the above-identified patent and that said Letters Patent is hereby corrected as shown below:

In the Specification

Column 1, line 7: Please write "35" in front of the first word of the line "U.S.C.".

Column 13, line 16: Please delete "$In_4Sn_3O_2$" between the words "or" and "or", and write "$In_4Sn_3O_{12}.$" in place thereof.

In the Claims

Column 23, line 13, 14 and 15 Claim 10: Please delete the word "bather" and write the word "barrier" in place thereof.

Signed and Sealed this
Twenty-second Day of March, 2016

Michelle K. Lee
*Director of the United States Patent and Trademark Office*